US009535302B2

(12) United States Patent
Lee

(10) Patent No.: US 9,535,302 B2
(45) Date of Patent: Jan. 3, 2017

(54) DISPLAY DEVICE

(71) Applicant: SAMSUNG DISPLAY CO., LTD., Yongin, Gyeonggi-Do (KR)

(72) Inventor: Hee-Kwon Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 49 days.

(21) Appl. No.: 14/490,467

(22) Filed: Sep. 18, 2014

(65) Prior Publication Data

US 2015/0228706 A1    Aug. 13, 2015

(30) Foreign Application Priority Data

Feb. 10, 2014 (KR) .................. 10-2014-0014927

(51) Int. Cl.
| H01L 27/32 | (2006.01) |
| G02F 1/1368 | (2006.01) |
| H05K 1/11 | (2006.01) |
| G02F 1/1345 | (2006.01) |
| H05K 1/02 | (2006.01) |
| H05K 1/18 | (2006.01) |

(52) U.S. Cl.
CPC ......... *G02F 1/1368* (2013.01); *G02F 1/13452* (2013.01); *H01L 27/3241* (2013.01); *H01L 27/3244* (2013.01); *H05K 1/117* (2013.01); *H05K 1/0245* (2013.01); *H05K 1/189* (2013.01); *H05K 2201/09409* (2013.01); *H05K 2201/09481* (2013.01); *H05K 2201/09672* (2013.01); *H05K 2201/09781* (2013.01); *H05K 2201/10128* (2013.01)

(58) Field of Classification Search
CPC .......................... H01L 27/3241; H01L 27/3244
See application file for complete search history.

(56) References Cited

U.S. PATENT DOCUMENTS

| 2006/0001792 A1* | 1/2006 | Choi ................... G02F 1/13458 349/54 |
| 2007/0216846 A1* | 9/2007 | Tseng ..................... G09G 3/006 349/149 |
| 2008/0100763 A1* | 5/2008 | Park ..................... G02F 1/13452 349/42 |
| 2013/0229401 A1* | 9/2013 | Kim ..................... G09G 3/3648 345/212 |

FOREIGN PATENT DOCUMENTS

| JP | 2009-81173 | 4/2009 |
| KR | 10-2006-0117590 | 11/2006 |
| KR | 10-2009-0111522 | 10/2009 |
| KR | 10-1292569 | 8/2013 |

* cited by examiner

*Primary Examiner* — Phat X Cao
(74) *Attorney, Agent, or Firm* — Lewis Roca Rothgerber Christie LLP

(57) ABSTRACT

A display device according to an example embodiment of the present invention includes a display panel configured to display an image, the display panel including a plurality of pixels, a chip on film (COF) coupled to the display panel, the COF comprising a driver, a plurality of COF wires and a plurality of COF pads, and a flexible printed circuit board (FPCB) coupled to the COF, the FPCB including a plurality of FPCB wires and a plurality of FPCB pads, wherein the plurality of COF pads are arranged in two rows, and wherein one or more COF pads of the plurality of COF pads in a first row of the two rows are one or more dummy pads.

11 Claims, 23 Drawing Sheets

RELATED ART

RELATED ART

RELATED ART

RELATED ART

RELATED ART

RELATED ART

RELATED ART

RELATED ART

RELATED ART

DISPLAY DEVICE

CROSS-REFERENCE TO RELATED APPLICATION

This application claims priority to and the benefit of Korean Patent Application No. 10-2014-0014927 filed in the Korean Intellectual Property Office on Feb. 10, 2014, the entire contents of which are incorporated herein by reference.

BACKGROUND

1. Field

The present invention relates to a display device.

2. Description of the Related Art

A display device includes a liquid crystal display (LCD), an organic light emitting diode (OLED) display, and the like, and particularly, the organic light emitting diode (OLED) display includes a display substrate providing a display region and a non-display region, and a sealing substrate that faces the display substrate for encapsulation and attached to the substrate by a sealant such as an epoxy. A plurality of light emitting elements coupled in a matrix form between scan lines and data lines constitute pixels located at the display region of the display substrate. The scan lines and the data lines of the display region extend respectively from a scan driver and a data driver located at the non-display region, for processing signals provided from the outside through pads to provide the processed signals to the scan lines and the data lines. The scan driver and the data driver include a driving circuit for processing the signals provided from the outside to generate scan signals and data signals, and are formed in the course of manufacturing the light emitting element or manufactured as a separate integrated circuit chip to be mounted on the display substrate.

In the case where the scan driver and the data driver are manufactured in an integrated circuit chip to be mounted on the display substrate, a drive IC may be mounted on a chip on film (COF) to be coupled to the pad of the display substrate.

One side of the chip on film is coupled to the display substrate, and the other side is coupled to a flexible printed circuit board (FPCB).

The above information disclosed in this Background section is only for enhancement of understanding of the background of the embodiments and therefore it may contain information that does not form the prior art that is known to a person of ordinary skill in the art.

SUMMARY

The present invention provides a display device in which a pad is stably coupled and stability of high speed signal transmitting and structural stability are obtained even though widths of the chip on film and the flexible printed circuit board (FPCB) attached to the display device are reduced.

A display device according to an example embodiment of the present invention may include: a display panel configured to display an image, the display panel comprising a plurality of pixels; a chip on film (COF) coupled to the display panel, the COF including a driver, a plurality of COF wires and a plurality of COF pads; and a flexible printed circuit board (FPCB) coupled to the COF, the FPCB including a plurality of FPCB wires and a plurality of FPCB pads, wherein the plurality of COF pads are arranged in two rows, and wherein one or more COF pads of the plurality of COF pads in a first row of the two rows are one or more dummy pads.

The driver of the COF may be coupled to the plurality of COF pads by the plurality of COF wires; and the plurality of COF wires coupling the plurality of COF pads in the first row to the driver may be formed at different layers from the plurality of COF wires coupling the plurality of COF pads of a second row of the two rows to the driver.

The one or more dummy pads may not be coupled to the driver by the plurality of COF wires.

The one or more dummy pads may be at a high speed signal transmitting region; in the high speed signal transmitting region, the one or more dummy pads may be arranged at the first row and high speed signal pads of the plurality of COF pads may be arranged at a second row of the two rows; and a pair of adjacent high speed signal pads of the plurality of COF pads may be supplied with positive (+) and negative (−) signals from the driver.

The lengths of the plurality of COF wires coupling the driver and each of the pair of adjacent high speed signal pads of the plurality of COF pads may be the same.

The high speed signal transmitting region may include a plurality of high speed signal transmitting regions in one COF.

The width of each of the dummy pads may be larger than the width of each of the other COF pads.

The plurality of FPCB pads may be arranged in two rows; the plurality of FPCB pads may be coupled to the plurality of COF pads; and one or more FPCB pads of the plurality of FPCB pads may be coupled with the one or more dummy pads of the COF may be one or more dummy pads of the FPCB.

The one or more dummy pads of the FPCB may not be coupled to a group portion.

The FPCB may further include: a group portion at one side of the FPCB, wherein the plurality of FPCB pads may be coupled to the group portion by the plurality of FPCB wires; and the plurality of FPCB wires coupling the plurality of FPCB pads in a first row of the two rows and the plurality of FPCB wires coupling the plurality of FPCB pads in a second row of the two rows may be at different layers.

The plurality of FPCB wires coupling the plurality of FPCB pads of the first row to the group portion may be at a first layer of the FPCB; the plurality of FPCB wires coupling the plurality of FPCB pads of the second row to the group portion may be at a third layer of the FPCB; a plane plate may be between the first layer and the third layer; and the third layer may include a plurality of grooves to pass the plurality of FPCB wires.

The region where the one or more dummy pads of the FPCB are located may be a high speed signal transmitting region; in the high speed signal transmitting region, the one or more dummy pads may be at the first row and high speed signal pads of the plurality of COF pads may be at the second row; and the groove may not be located at the third layer of the FPCB in the high speed signal transmitting region.

According to another aspect, a display device may include: a display panel configured to display an image, the display panel including a plurality of pixels; a chip on film (COF) coupled to the display panel, the COF including a driver, a plurality of COF wires and a plurality of COF pads; and a flexible printed circuit board (FPCB) coupled to the COF, the FPCB including a plurality of FPCB wires and a plurality of FPCB pads, wherein the plurality of FPCB pads are arranged in two rows, and wherein one or more FPCB pads of the plurality of FPCB pads in a first row of the two rows are one or more dummy pads.

The FPCB may further include a group portion at one side of the FPCB, the group portion being coupled to the plurality of FPCB pads by the plurality of FPCB wires; the plurality of FPCB wires may couple the one or more FPCB pads in the first row to the group portion, the plurality of FPCB wires being at the same layer as the FPCB pad; and the plurality of FPCB wires may couple the one or more FPCB pads in a second row of the two rows to the group portion, the plurality of FPCB wires being at a different layer from the FPCB pad.

The plurality of FPCB wires coupling the one or more FPCB pads in the first row to the group portion may be at a first layer of the FPCB pad and the FPCB; the plurality of FPCB wires coupling the one or more FPCB pads in the second row to the group portion may be at a third layer of the FPCB; the FPCB may further include a second layer having a plane plate shape between the first layer and the third layer; and the third layer may include a plurality of grooves configured to pass the plurality of FPCB wires.

The one or more dummy pads of the FPCB may not be coupled to the group portion by the plurality of FPCB wires.

The region where the one or more dummy pads of the FPCB are located may be a high speed signal transmitting region, and the plurality of grooves may not be at the third layer of the FPCB in the high speed signal transmitting region.

The width of each of the dummy pads may not be larger than the width of each of the other FPCB pads.

The plurality of COF pads may be arranged in two rows; the plurality of COF pads and the plurality of FPCB pads may contact each other; and a signal from the driver is may not be transmitted to the plurality of COF pads contacting the one or more dummy pads of the FPCB.

In one or more pads of the plurality of COF pads contacting high speed signal pads of the plurality of FPCB pads, a pair of positive (+) and negative (−) signals may be transmitted to a pair of adjacent COF pads.

As described above, in the display device according to an example embodiment of the present invention, although the widths of the chip on film and the flexible printed circuit board (FPCB) that are attached to the display device are decreased, the pad may be stably connected, and the stability of the high speed signal transmitting and the structural stability may be obtained.

DETAILED DESCRIPTION OF THE EMBODIMENTS

Figure 1:
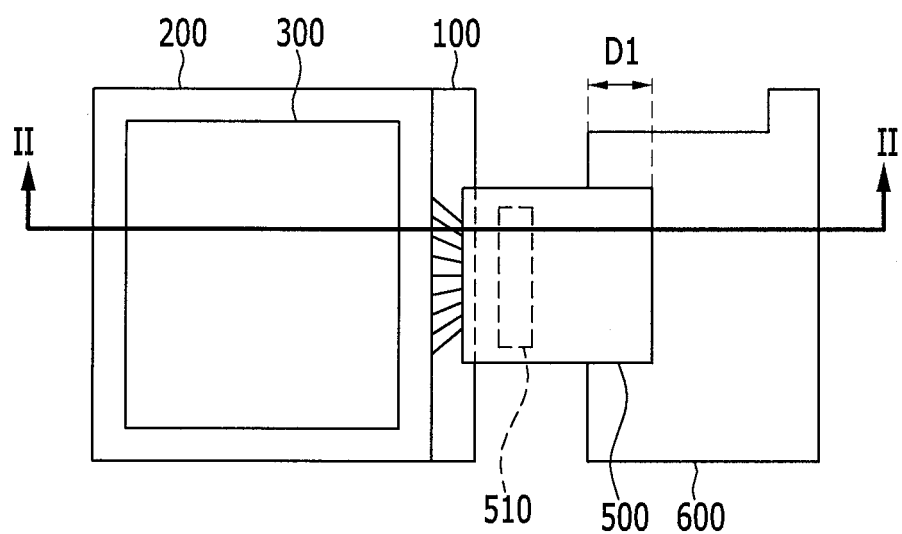
FIG. 1 is a view showing a connection relationship of a display panel, a chip on film, and a flexible printed circuit board (FPCB) in a display device according to an example embodiment of the present invention.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. When an element is referred to as being "directly on" another element, there are no intervening elements present.

A display device according to an example embodiment of the present invention will be described with reference to accompanying drawings.

Figure 2:
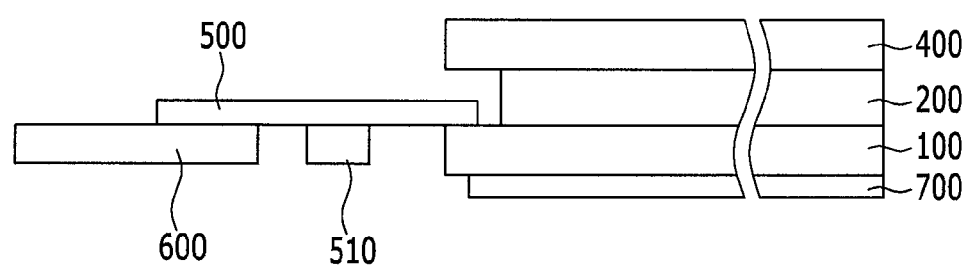
FIG. 2 is a cross-sectional view of the display device of FIG. 1 taken along the line II-II.

FIG. 1 is a view showing a connection relationship of a display panel 300, a chip on film 500, and a flexible printed circuit board (FPCB) 600 in a display device according to an example embodiment of the present invention. FIG. 2 is a cross-sectional view of the display device FIG. 1 taken along the line II-II.

According to an embodiment of the present invention, the display panel 300 may include a lower substrate 100 and an upper substrate 200. The display panel may be a liquid crystal display or an organic light emitting display (or organic light emitting diode (OLED) display).

When the display panel is a liquid crystal display, a liquid crystal layer is interposed between the lower substrate 100 and the upper substrate 200. The lower substrate 100 includes a plurality of pixel areas. In each pixel area, gate lines extending in a first direction, data lines extending in a second direction crossing the first direction and insulatively crossing the gate lines, and pixel electrodes are included. Further, in each pixel area, a thin film transistor which is electrically coupled to the gate line and the data line and electrically coupled to the corresponding pixel electrode is provided. The thin film transistor supplies a driving signal provided to the corresponding pixel electrode. Further, a driver IC may be included at one side of the first substrate. The driver IC receives various signals from the outside, and outputs driving signals for driving the display panel 300 to the thin film transistor in response to various inputted control signals.

The upper substrate may include an RGB color filter implementing a predetermined color by using light provided from a backlight unit on one side, and a common electrode formed on the RGB color filter and facing the pixel electrode. Here, the RGB color filter may be formed through a thin film process. According to an embodiment of the present invention, the forming of the color filter on the upper substrate is described as an example, but the color filter is not limited thereto. For example, the color filter may be formed on the lower substrate. Further, the common electrode of the upper substrate may be formed on the lower substrate.

When the display panel is an organic light emitting display, it includes a semiconductor layer in which a semiconductor, a gate insulating layer, a gate line, a data line, and a pixel electrode are sequentially formed on the lower substrate 100, and an organic emission layer formed on the semiconductor layer. When the display panel is an organic light emitting display, the upper substrate 200 may be a thin film encapsulation layer.

The thin film encapsulation layer may include a plurality of deposited inorganic layers and organic layers. The inorganic layer may be one selected from AlOx, TiOx, ZnO, SiOx, and SiNx, and the inorganic layers and the organic layers may be alternately deposited, however a sequence and a material of the layers are not limited thereto.

According to an embodiment of the present invention, the display panel may be a flexible organic light emitting device, and in this case, the lower substrate 100 and the upper substrate 200 are flexible substrates. At this time, the substrate may include polyimide. The substrate may be flexible, thereby being easily bent. The upper substrate 200 may be made of a plurality of organic layers and inorganic layers that are deposited without a separate usage of the substrate.

Referring to FIG. 2, when the display panel is the organic light emitting display, the display panel may include a protection layer 700 positioned under the lower substrate 100 and a cover glass 400 positioned on the upper substrate 200.

The protection layer 700 may be made of a protection film. In this case, the protection film may include at least one material selected from polyethylene terephthalate (PET), polyethylene naphthalate (PEN), polyethylene sulfide (PES), and polyethylene (PE).

The protection layer 700 and the lower substrate 100 may be adhered to each other with an adhesive.

The cover glass 400 may be made of an OCA (optically clear adhesive) film. A phase retardation film and a polarization film may be provided between the cover glass 400 and the upper substrate 200.

Referring to FIG. 1 and FIG. 2, the display panel 300 and the chip on film 500 are coupled together. Also, the chip on film 500 and the flexible printed circuit board (FPCB) 600 are coupled together.

A driver 510 is provided to the chip on film 500, and driving lines extending from the display panel 300 are coupled to the driver 510 of the chip on film 500.

In some embodiments, in the driver 510 of the chip on film 500, a plurality of wires extending in a direction opposite to the display panel are coupled to a plurality of pads formed at an edge of the chip on film 500.

In some embodiments, a plurality of pads are formed at one side of the flexible printed circuit board (FPCB) 600. Accordingly, the pad of the chip on film 500 (i.e., COF pad) and the pad of the flexible printed circuit board (FPCB) 600 (i.e., FPCB pad) are in contact in a region D1 of FIG. 1.

In some embodiments, one end of the flexible printed circuit board (FPCB) 600 is coupled to a connector. The flexible printed circuit board (FPCB) 600 may be coupled with a hard wire substrate through the connector.

Recently, the size of the display device has decreased due to commercial availability of a wearable device. Accordingly, down-sizing of the display panel and the chip on film coupled thereto, as well as the flexible printed circuit board (FPCB), may be used. However, when the width of the chip on film and the flexible printed circuit board (FPCB) becomes narrow, a space for the pad connection of the chip on film and the flexible printed circuit board (FPCB) is not sufficient. The embodiments of the present invention relates to a display device capable of stably connecting the chip on film and the flexible printed circuit board (FPCB) even though the display device is down-sized.

The display device according to a comparative example will be described with reference to FIG. 3 to FIG. 7.

Figure 3:
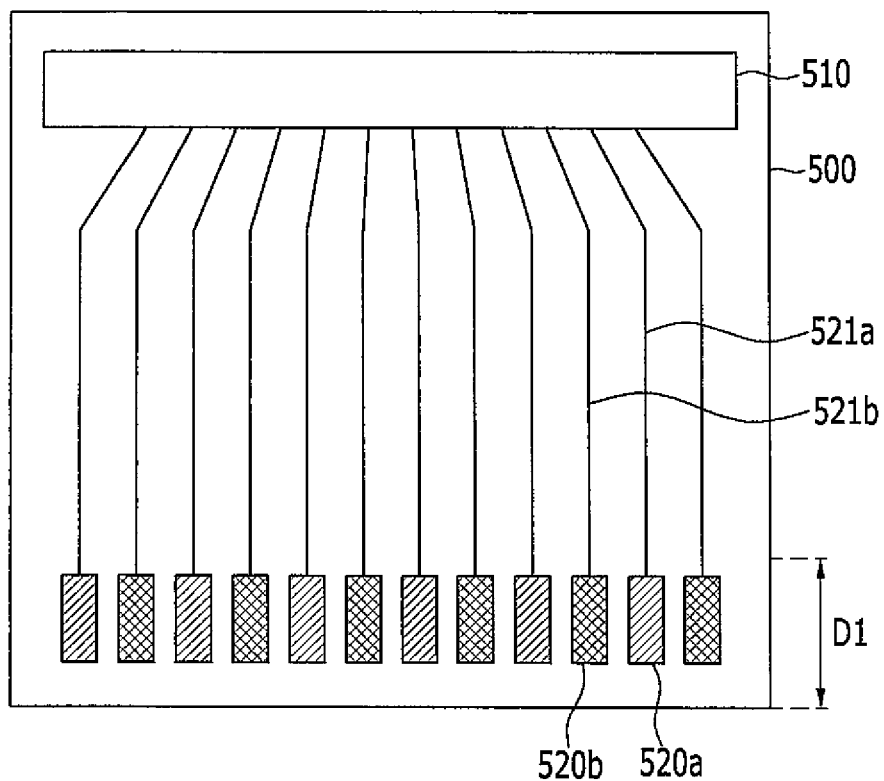
FIG. 3 is a view showing a chip on film of a display device according to a comparative example.

FIG. 3 is a view showing a chip on film of a display device according to a comparative example.

Figure 4:
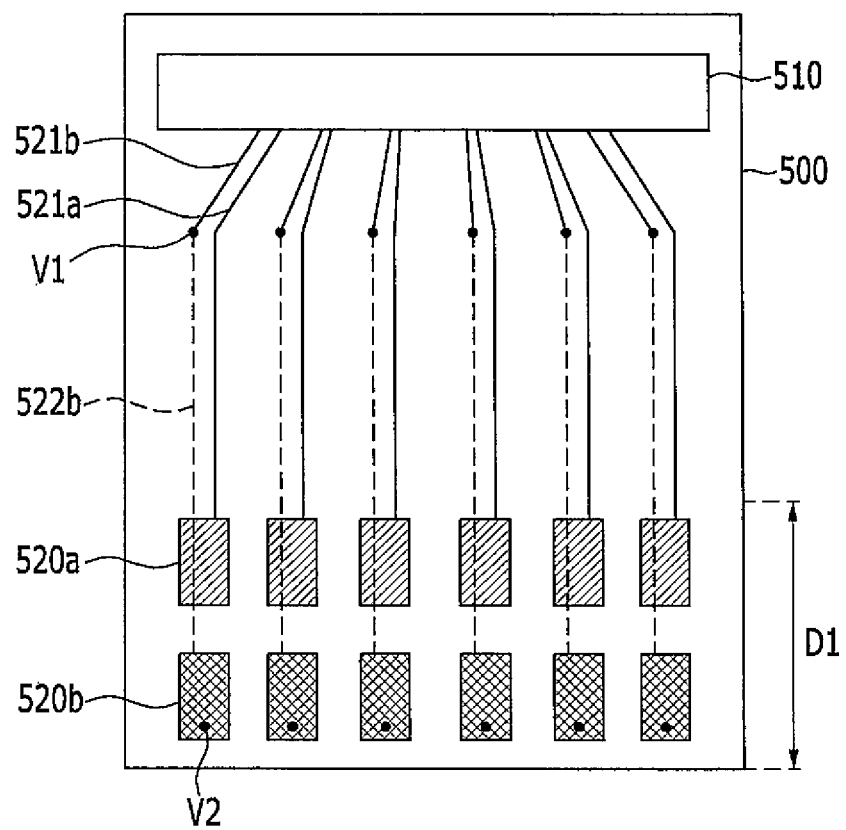
FIG. 4 is a view showing a chip on film of a display device according to another comparative example.

FIG. 4 is a view showing a chip on film of a display device according to another comparative example.

Referring to FIG. 3, the chip on film of the display device according to a comparative example includes a driver 510, a plurality of pads 520a and 520b, and wires 521a and 521b connecting the driver 510 and the plurality of pads 520a and 520b.

In this case, the plurality of pads 520a and 520b receive signals forming a pair of positive (+) and negative (−) polarities. That is, the pad 520a is applied with a positive (+) signal, and the pad 520b is applied with a negative (−) signal. The polarities of these signals are arbitrary, and instead, the pad 520a may be applied with the negative (−) signal, and the pad 520b may be applied with the positive (+) signal. According to an embodiment of the present invention, the pad applied with the positive (+) signal is indicated by "a", and the pad applied with the negative (−) signal is indicated by "b". However, the signals may be oppositely applied.

As shown in FIG. 3, in a conventional display device, a transverse width of the chip on film is wide enough such that the pads are arranged in one row.

In some embodiments, the width of the chip on film may become narrower because of application to the wearable device, which may be smaller in size. FIG. 4 shows the chip on film according to another comparative example. FIG. 4 shows the chip on film of which the width is narrower.

Referring to FIG. 4, a plurality of pads transmitted with the pair of signals are positioned in two rows in the comparative example. That is, the pads 520a transmitted with the positive (+) signal are at a first row, and the pads 520b transmitted with the negative (−) signal are at a second row.

When the pads are arranged in two rows, although the width of the chip on film may be narrow, a sufficient number of pads may be arranged on the chip on film. However, when the pads are arranged in the two rows, a connection problem between the driver and the pad may be generated.

Referring to FIG. 4, in the comparative example, the pad 520a of the first row close to the driver 510 is directly coupled to the wire at the same layer as the driver 510.

However, it is difficult to couple the pad 520b of the second row, which is farther from the driver 510 than the pad 520a of the first row, at the same layer as the driver 510 due to the wire that couples the pad 520a of the first row.

Accordingly, referring to FIG. 4, the connection of the pad 520b of the second row and the driver 510 is performed by a method of connecting the wire 521b coupled to the driver 510 to an underlying wire 522b through a first hole V1 and again contacting the underlying wire 522b with the pad 520b through a second hole V2.

Figure 5:
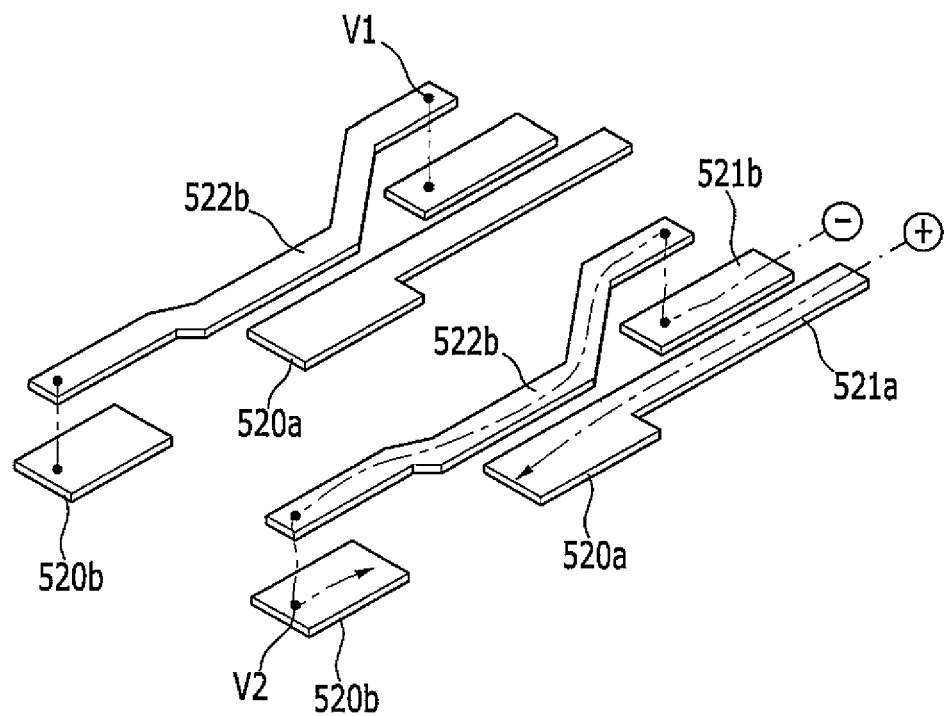
FIG. 5 is a view showing a pad connection method of a chip on film in the display device of FIG. 4 according to a comparative example.

FIG. 5 shows the pad connection method of the chip on film in the display device according to the comparative example of FIG. 4. Referring to FIG. 5, the positive (+) signal is directly transmitted to the pad 520a through the wire 521a.

However, the negative (−) signal is transmitted through the wire 521b, and is then transmitted to the wire 522b at a different layer through the first hole V1. The wire 522b is bent to pass over the pad 520a, and then couples with the pad 520b through the second hole V2 on the pad 520b. That is, the negative (−) signal is transmitted to the wire 522b at a different layer through the hole to be transmitted to the pad 520b.

The wire 522b is electrically insulated from the pad 520a and is bent to pass over the pad 520a. This is to obtain structural stability when pressing the chip on film and the flexible printed circuit board (FPCB) later.

Figure 6:
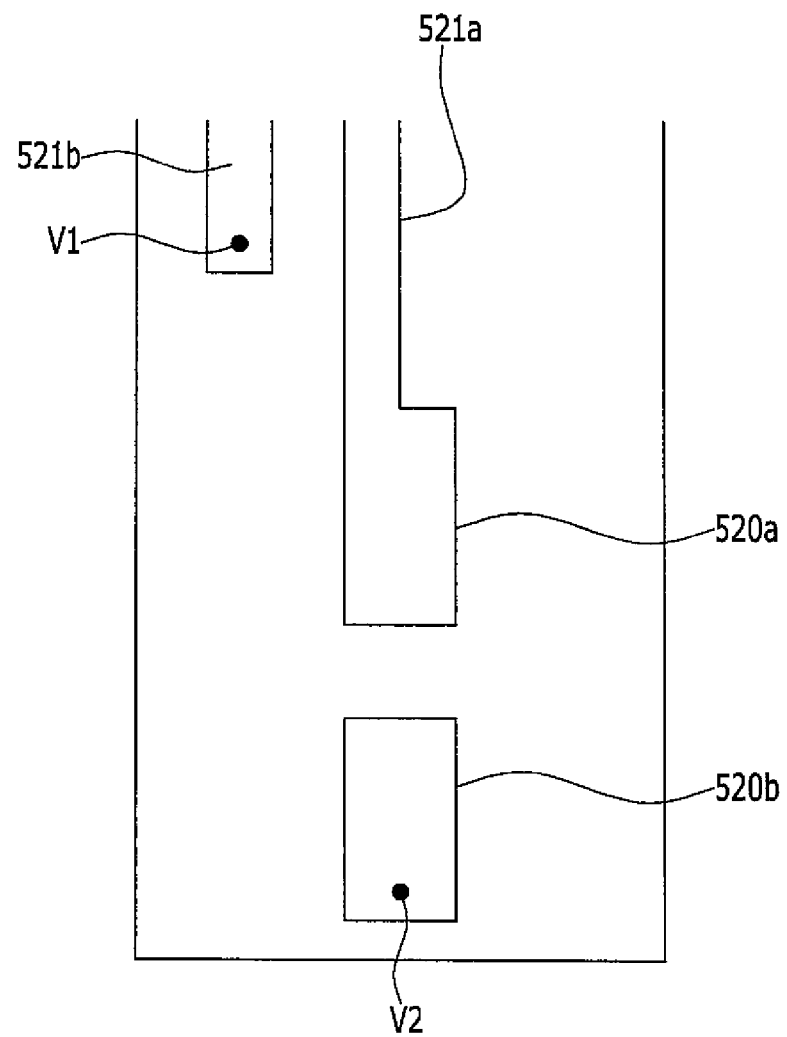
FIG. 6 is a view showing a first layer after dividing the chip on film of FIG. 5 for each layer.

FIG. 6 is a view showing a first layer after dividing the chip on film of FIG. 5 for each layer. Referring to FIG. 6, at the first layer of a bottom surface, pad portions 520a and 520b, a wire 521a coupled to the pad portion, and a wire 521b that is not coupled to the pad are formed. The first hole V1 is formed at one side of the wire 521b that is not coupled to the pad portion, and the second hole V2 is formed at one side of the pad portion 520b that is not coupled to the wire.

Figure 7:
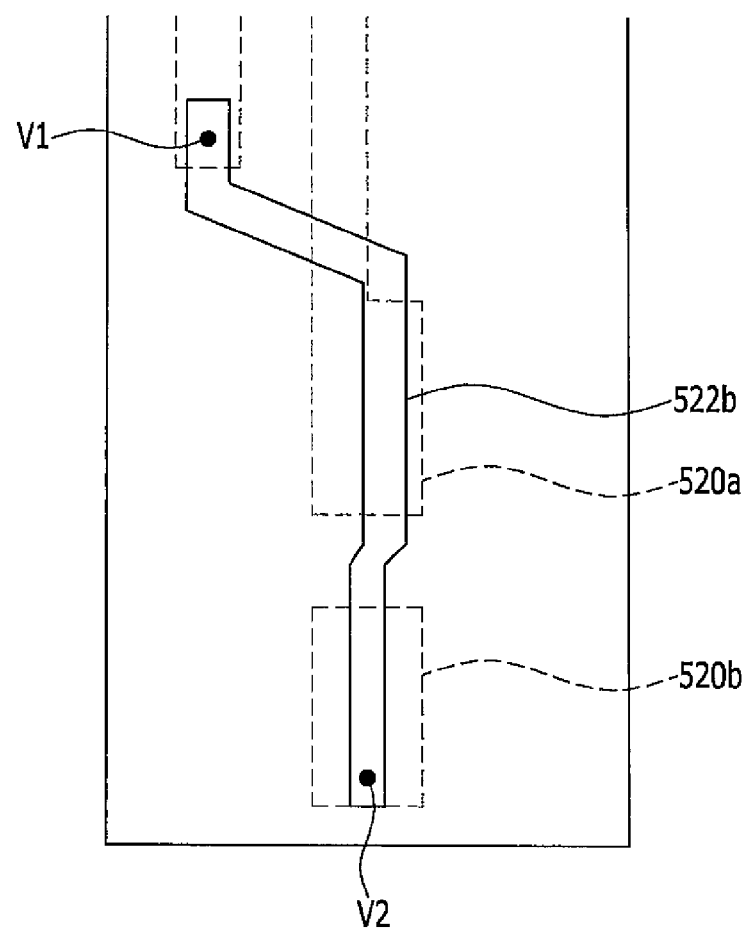
FIG. 7 is a view showing a second layer after dividing the chip on film of FIG. 5 for each layer.

FIG. 7 is a view showing a second layer after dividing the chip on film of FIG. 5 for each layer. Referring to FIG. 7, at the second layer of the chip on film, a wire 522b coupling the wire 521b and the pad 520b is formed. The first hole V1 and the second hole V2 are formed at respective ends of the wire 522b to couple the wire 521b and the pad 520b of the first layer.

As described above in the display device according to a comparative example, the pads are arranged in the two rows, and the wire, the driver, and the pad are formed at two layers, which makes it suitable for down-sizing the display device.

However, in this case, as shown in FIG. 5, progressing paths of the positive (+) signal and the negative (−) signal are differentiated. That is, the transmitting path of the positive (+) signal is relatively short (compared to the negative (−) signal) because the positive (+) signal is directly transmitted in the first layer without passing through the second layer of the chip on film. However the negative (−) signal is transmitted into the first layer through the second layer such that the moving distance (or transmission distance) of the negative (−) signal is relatively longer compared to the positive (+) signal. The transmitting length difference of the signal generates a discontinuity in high speed signal transmission (mobile industry processor interface (MIPI)), and therefore when there is a mismatch, a distortion of display quality may be generated.

As described above, the chip on film of the display device according to a comparative example has a problem that the signal transmission is unstable because of the transmitting length difference of the positive (+) and negative (−) signals.

The flexible printed circuit board (FPCB) of the display device according to a comparative example will be described with reference to FIG. 8 to FIG. 11.

Figure 8:
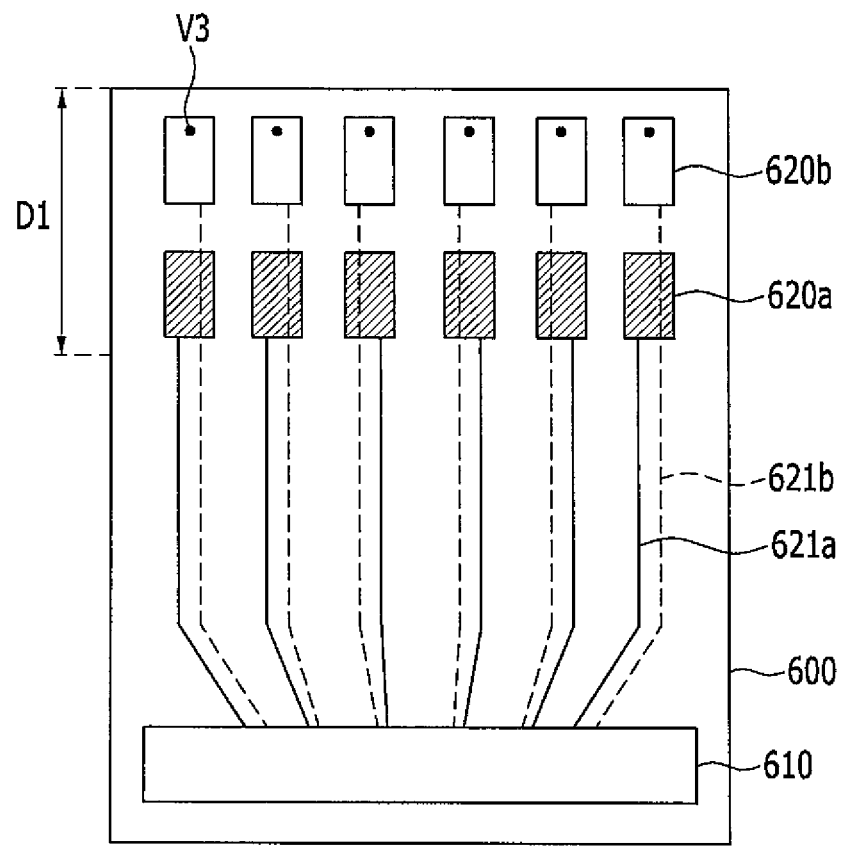
FIG. 8 is a view of a flexible printed circuit board (FPCB) according to a comparative example.

FIG. 8 is a view of a flexible printed circuit board (FPCB) 600 according to a comparative example. The region D1 of FIG. 8 is a portion of the FPCB 600 in which the pads are formed, and contacts the pads of the chip on film.

Referring to FIG. 8, the flexible printed circuit board (FPCB) 600 includes a plurality of pads 620a and 620b arranged in two rows, wires 621a and 621b coupled to the pads 620a and 620b, respectively, and a group portion 610 in which the wires are gathered.

Referring to FIG. 8, in the flexible printed circuit board (FPCB) 600 of the display device according to a comparative example, like the chip on film, the pad portions are also positioned in two rows. Accordingly, the pad 620a closer to the group portion 610 is coupled through the wire 621a formed at the same layer as the pad 620a and the group portion 610, however the pad 620b farther from the group portion 610 is coupled to the wire 621b (indicated by a dotted line) positioned under the flexible printed circuit board (FPCB) 600 through the third hole V3.

Figure 9:
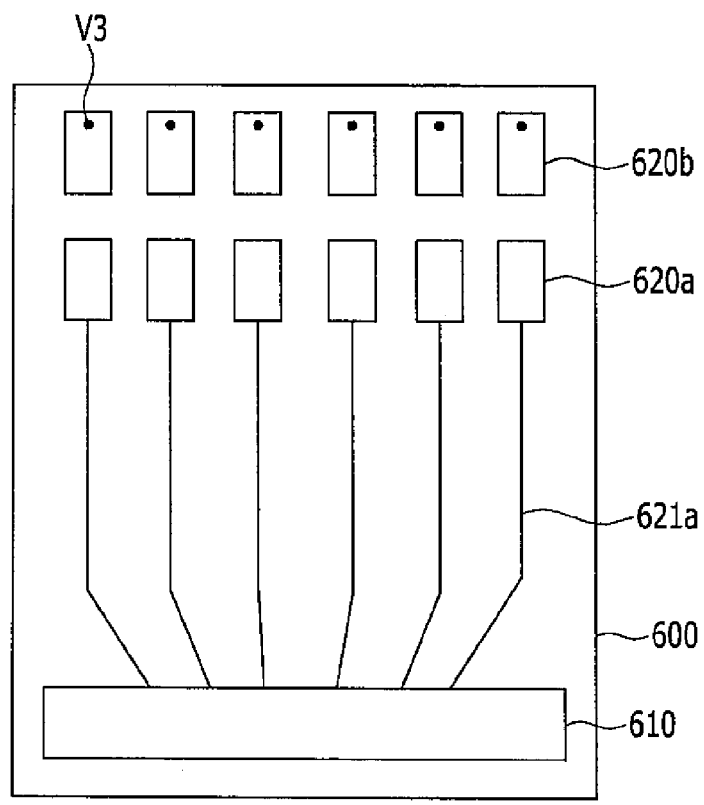
FIG. 9 is a view showing a first layer of the flexible printed circuit board (FPCB) of FIG. 8.

FIG. 9 is a view showing a first layer of the flexible printed circuit board (FPCB) 600 of FIG. 8. Referring to FIG. 9, at the first layer, the plurality of pad portions 620a and 620b, the group portion 610, and the wire 621a coupling the pad 620a and the group portion 610 are formed.

Figure 10:
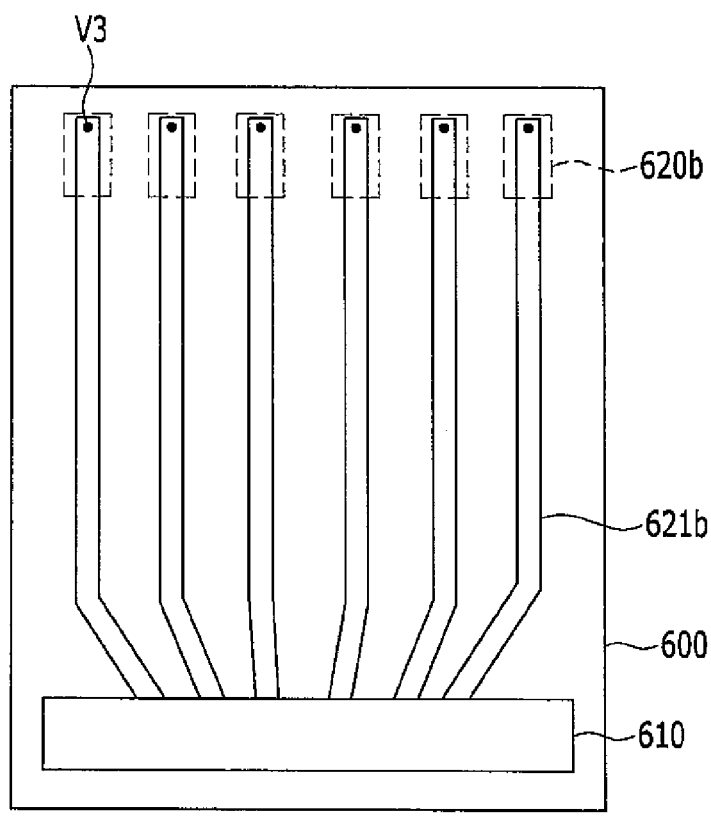
FIG. 10 is a view showing a third layer of the flexible printed circuit board (FPCB) of FIG. 8.

FIG. 10 is a view showing a third layer of the flexible printed circuit board (FPCB) 600 of FIG. 8. Referring to FIG. 10, the wire 621b is formed at the third layer and is coupled to the pad 620b of the first layer through a third hole V3. In FIG. 9, the wire is shown as a line, and the wire of FIG. 10 is shown as a line having a volume (or thick line), however this is only for convenience of the drawings, and the actual width of the wires of FIG. 9 and FIG. 10 may be the same.

Between the first layer and the third layer of the flexible printed circuit board (FPCB) 600, a second layer for electrically insulating the first layer and the third layer is provided. In some embodiments, a separate wire is not formed at the second layer.

Figure 11:
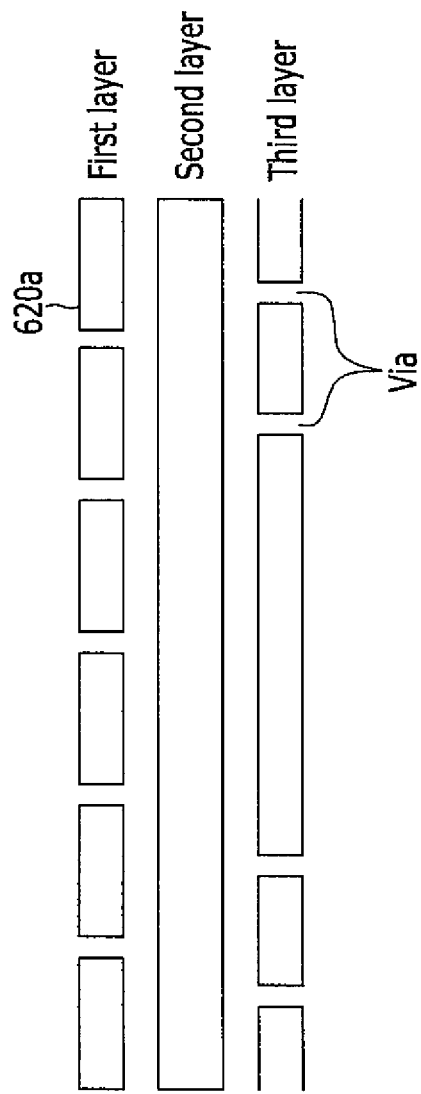
FIG. 11 is a cross-sectional view of a flexible printed circuit board (FPCB) of a display device according to a comparative example.

FIG. 11 is a cross-sectional view of a flexible printed circuit board (FPCB) 600 of a display device according to a comparative example.

Referring to FIG. 11, a plurality of pads 620a are formed at the first layer of the flexible printed circuit board (FPCB) 600.

The second layer may be an insulating layer having a plate shape.

The pad is not formed at the third layer, however, as described above, a via to pass the wire formed at the third layer is formed.

That is, referring to FIG. 8, the wire coupled to the pad 620a extends with the same layer as the pad 620a and is gathered at the group portion 610, however the wire coupled to the pad 620b extends into the third layer under the pad and is gathered at the group portion 610. Accordingly, the wire 621b passes through a groove at the third layer of the flexible printed circuit board (FPCB) 600.

Accordingly, the via is partially formed at the third layer of the flexible printed circuit board (FPCB) 600 by the formation of the groove, and this generates structural instability in the contact process of the flexible printed circuit board (FPCB) 600 and the chip on film.

Figure 12:
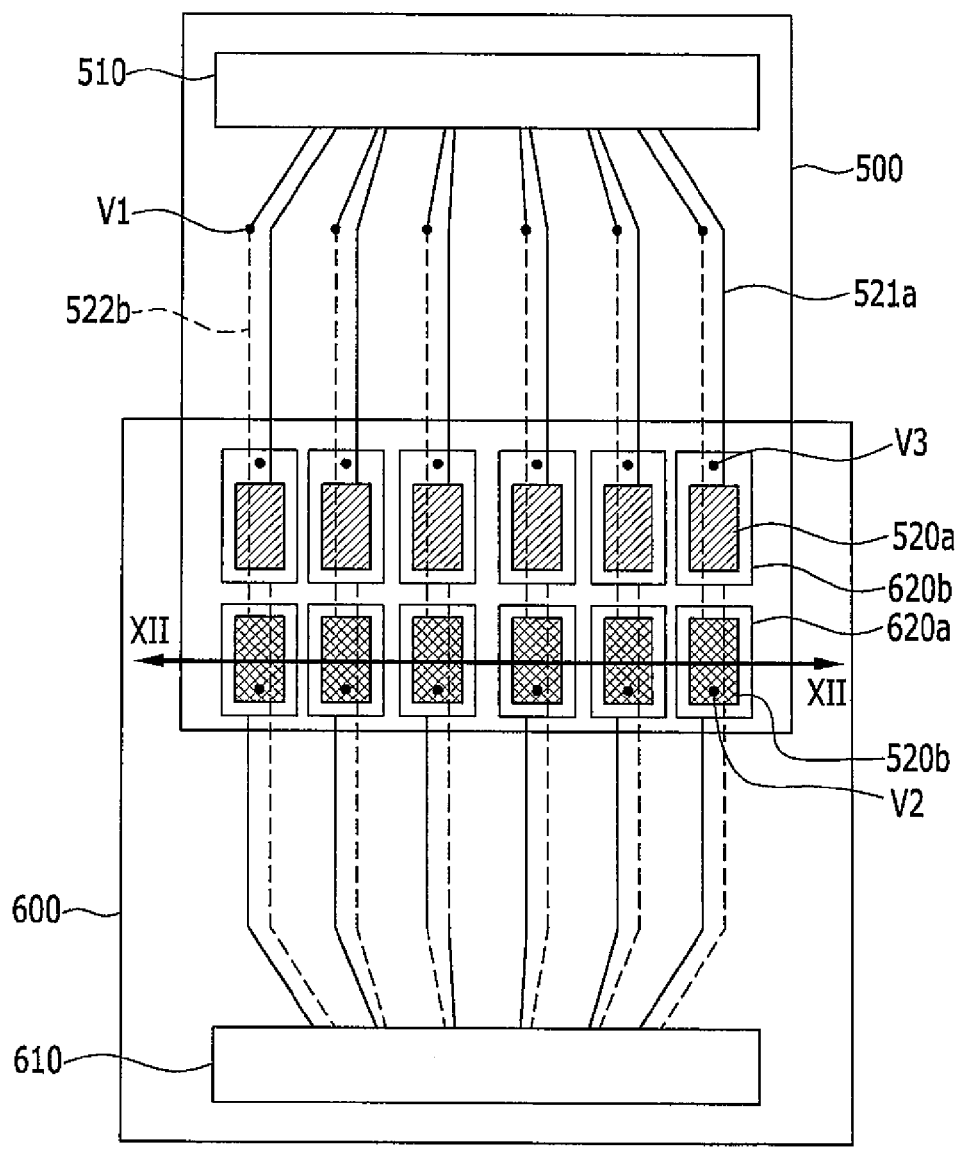
FIG. 12 is a view showing a contact shape of a chip on film and a flexible printed circuit board (FPCB) of a display device according to a comparative example.

Next, the contact shape of the chip on film 500 and the flexible printed circuit board (FPCB) 600 of the display device according to a comparative example will be described with reference to FIG. 12. FIG. 12 is a view showing a contact shape of a chip on film 500 and a flexible printed circuit board (FPCB) 600 of a display device according to a comparative example.

Referring to FIG. 12, the pads 520a and 520b of the chip on film 500 and the pads 620a and 620b of the flexible printed circuit board (FPCB) 600 are coupled with each other. That is, the first layer of the chip on film 500 and the first layer of the flexible printed circuit board (FPCB) 600 are coupled (e.g., in contact).

Referring to FIG. 12, the pad 520a directly coupled to the driver 510 in the chip on film 500 contacts the pad 620b coupled to the wire through the third hole in the flexible printed circuit board (FPCB) 600.

Likewise, the pad 520b coupled to the driver 510 through the holes V1 and V2 in the chip on film 500 contacts the pad 620a directly coupled to the group portion 610 of the flexible printed circuit board (FPCB) 600 at the same layer without the hole.

Figure 13:
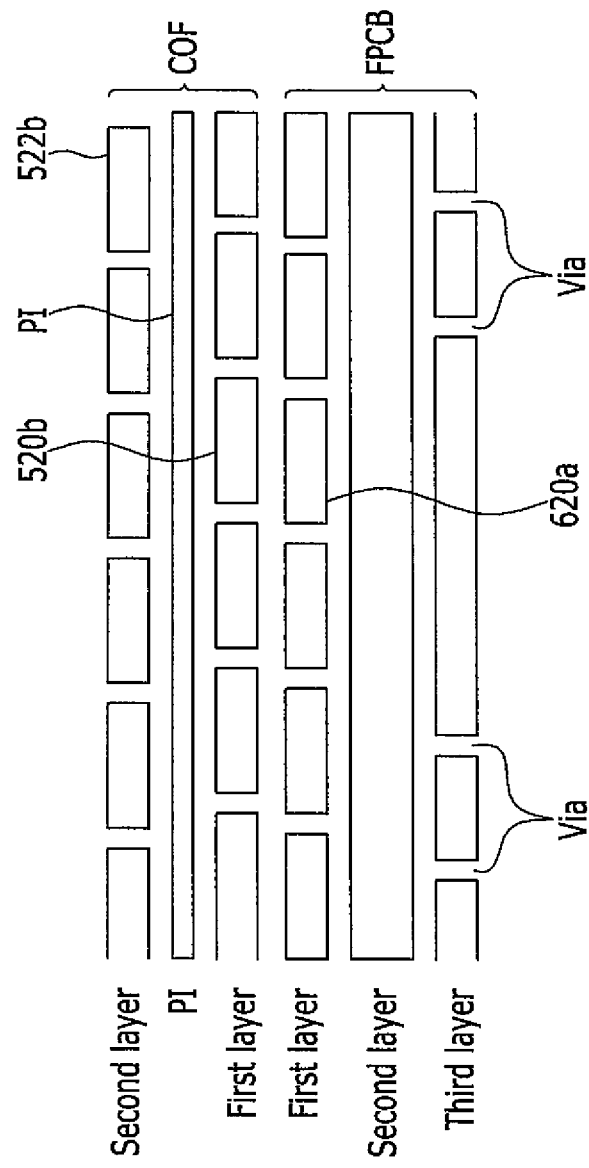
FIG. 13 is a cross-sectional view taken along the line XII-XII of FIG. 12.

FIG. 13 is a cross-sectional view taken along the line XII-XII of FIG. 12. Referring to FIG. 13, the pad 620a formed at the first layer of the flexible printed circuit board (FPCB) 600 and the pad 520b formed at the first layer of the chip on film 500 are coupled.

As described above, the via is formed at the third layer of the flexible printed circuit board (FPCB) 600. This is a space to pass the wire at the third layer because the pad 620b positioned farther from the group portion 610 is coupled to the group portion through the wire formed at the third layer.

The chip on film 500 and the flexible printed circuit board (FPCB) 600 are coupled through a pressing process. In this case, structural instability is generated because of the via formed at the third layer (lowest layer in FIG. 13) of the flexible printed circuit board (FPCB) 600. That is, when applying a pressure to an entire adhesion area with the same force, the region in which the via is formed does not transmit the force to the bottom. Accordingly, in the region of the chip on film 500, a polyimide (PI) film electrically insulating the first layer and the second layer may be bent or crushed in the pressing process.

As described above, in the display device according to a comparative example, the pad portions are arranged in two rows and the wires coupling the pad portions are coupled to the different layers through the hole to solve the problem generated when the areas of the chip on film 500 and the flexible printed circuit board (FPCB) 600 are decreased.

However, as described above, when transmitting the signal through the wires formed at the different layers in the pad portion of the chip on film 500, the difference of the path transmitting the signal is generated. Accordingly, discontinuity of the signal may be generated by the path difference when transmitting the high speed signal formed of the pair.

Also, in the flexible printed circuit board (FPCB) according to a comparative example, the via (e.g., via hole) is used to pass the wire coupled to the pad portion at the third layer and a step is generated under the flexible printed circuit board (FPCB) 600 due to the formation of the via. The underlying step generates the structural instability when pressing the chip on film 500 and the flexible printed circuit board (FPCB) 600 for contact. Accordingly, there is the problem that the film insulating the first layer and the second layer may be bent and crushed in the contact.

However, the display device according to an example embodiment forms a dummy pad at a portion of the chip on film and transmits the pair of signals in parallel to the pads in the region where the high speed signal is transmitted, and thereby the transmitting paths of the high speed signals forming the pair are the same. Accordingly, as illustrated in the comparative example, the problem due to the path difference of the pair signals may be solved when transmitting the high speed signals.

Next, the chip on film display device according to an example embodiment of the present invention will be described with reference to FIG. 14.

Figure 14:
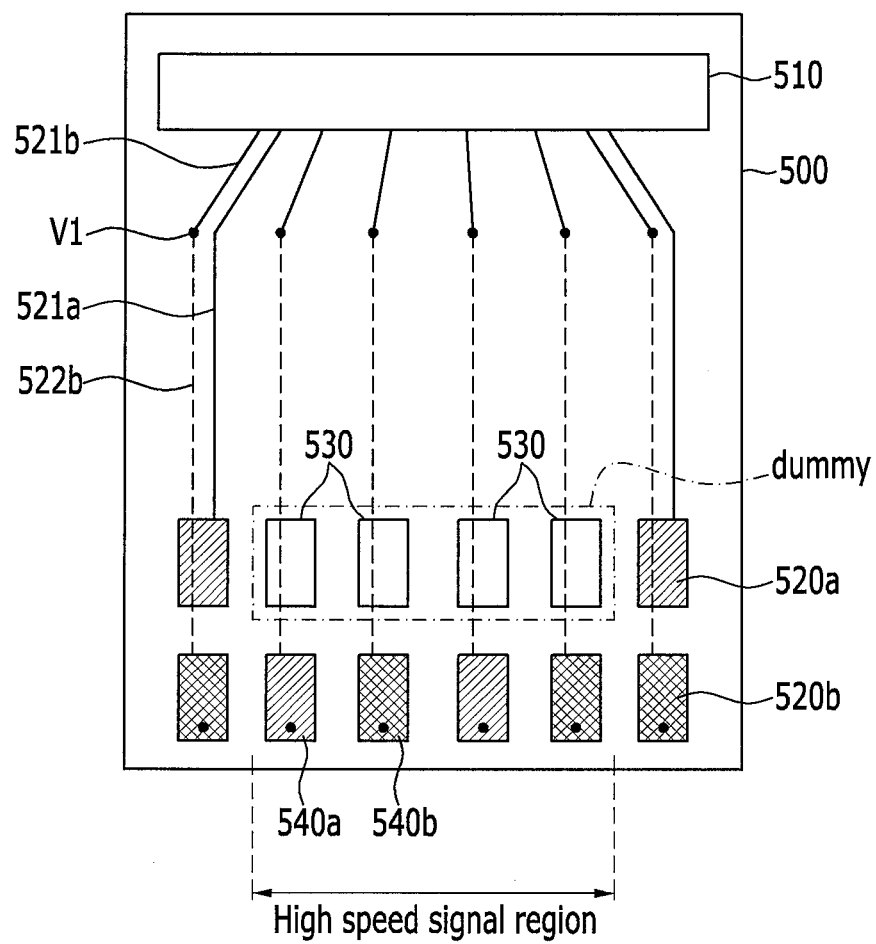
FIG. 14 is a view of a chip on film of a display device according to an example embodiment of the present invention.

FIG. 14 is a view of a chip on film of a display device according to an example embodiment of the present invention. Referring to FIG. 14, in the chip on film 500 of the display device according to an example embodiment of the present invention, the pad arrangement and the connection shape of the high speed signal region as a portion of the chip on film 500 is different from other regions. In FIG. 14, only a portion of the actual pad is shown, however there may actually be several tens to several hundreds of pads, and the high speed signal region may be a portion among the several tens or several hundreds of pads.

Referring to FIG. 14, a pad 530 positioned at the first row in the high speed signal region is a dummy pad that is not coupled to the driver 510. That is, the dummy pad 530 is not coupled to the driver 510.

Referring to FIG. 14, for the pads positioned at a general region (that is, the regions that are not the high speed signal region), the pads transmitted with the pair of signals are positioned upward and downward (e.g., adjacent its corresponding pair). That is, the pad 520a positioned at the first row is transmitted with the positive (+) signal, and the pad 520b positioned at the second row is transmitted with the negative (−) signal. In FIG. 14, the pad transmitted with the positive (+) signal is indicated by an oblique line pattern and the pad transmitted with the negative (−) signal is indicated by a lattice pattern.

Referring to FIG. 14, in the general region, the oblique line pattern pad and the lattice pattern pad are positioned side by side in adjacent rows. Accordingly, for the pads (the lattice pattern pad) positioned at the second row, the transmitting path of the signal is elongated compared with the pad positioned at the first row. The transmitting path difference of the signals generates a problem in the case of the high speed signal.

Accordingly, the chip on film 500 of the display device according to an example embodiment of the present invention arranges the pad portions side by side in each row in the high speed signal region. That is, referring to FIG. 14, in the high speed signal region, a pad 540*a* (the oblique line pattern) transmitted with the positive (+) signal and a pad 540*b* (the lattice pattern) transmitted with the negative (−) signal are positioned side by side (e.g., adjacent each other) at the second row. Accordingly, the path lengths of the signals transmitted as a pair are the same. Therefore, discontinuity of the signals is not generated when transmitting the high speed signal.

In the high speed signal region, the pad positioned at the first row is not coupled to the driver 510 by the dummy pad 530. However, due to the presence of the dummy pad 530, the wire 522*b* coupling the pads 540*a* and 540*b* for receiving the signals and the driver 510 may be stably formed. That is, when applying the pressure, the wire 522*b* is not bent because of the presence of the dummy pad 530.

Figure 15:
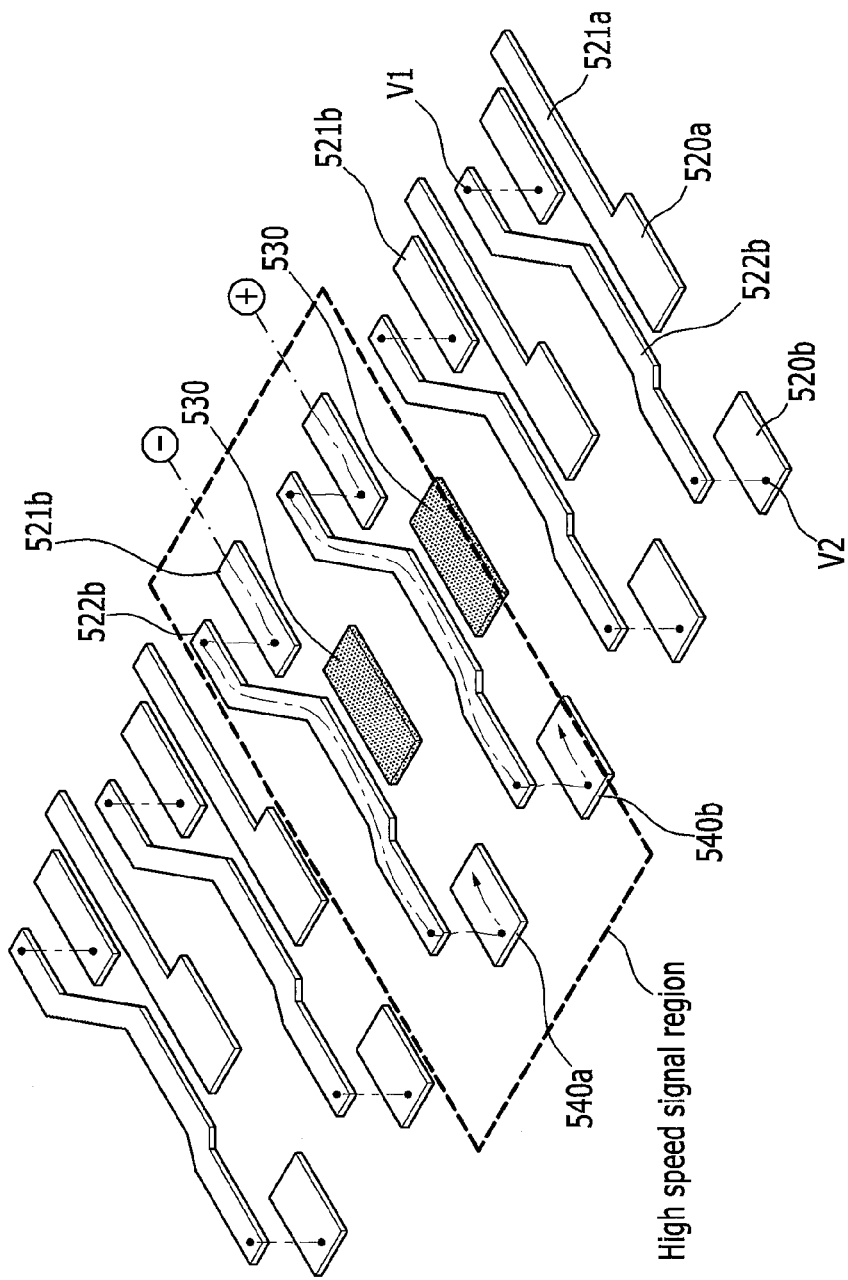
FIG. 15 is a view showing a pad connection method of a chip on film in the display device according to an example embodiment of FIG. 14.

FIG. 15 is a view showing a pad connection method of a chip on film 500 in the display device according to an example embodiment of FIG. 14.

Referring to FIG. 15, in the general region that is not the high speed signal region, the connection method of the pad and the driver and the signal transmitting method are the same as the conventional comparative example.

That is, in the general region, the positive (+) signal is directly transmitted to the pad 520*a* through the wire 521*a*. However, the negative (−) signal is transmitted through the wire 521*b*, and then, is transmitted to the wire 522*b* of the different layer through the first hole V1. The wire 522*b* is bent to pass the pad 520*a*, and then couples the pad 520*b* through the second hole V2 on the pad 520*b*. That is, the negative (−) signal is coupled to the wire at the different layer to be transmitted to the pad.

As described above, in the general region, the positive (+) signal is transmitted according to the wire formed at the first layer (the same layer as the pad), and the negative (−) signal is transmitted according to the wire formed as the second layer (the different layer from the pad). That is, the path lengths of the positive (+) signal and the negative (−) signal are different.

However, referring to FIG. 15, in the high speed signal region, the pad 520*a* is not formed at the first row. Instead, the dummy pad 530 that is not coupled to the driver is formed.

Also, in the high speed signal region, the pair of signals are transmitted to the pads 540*a* and 540*b* that are formed side by side at the second row. That is, in the general region, the positive (+) signal is transmitted to the pad of the first row and the negative (−) signal is transmitted to the pad of the second row, however in the high speed signal region, the positive (+) signal and the negative (−) signal are both transmitted to the pads formed side by side at the second row. Therefore, the path lengths of the pair signals are the same, and accordingly the instability of the signal due to the path length difference is not generated.

This high speed signal region may exist at one portion of the chip on film or it may exist in a plurality of portions of the chip on film. Also, in FIG. 14, only one pair of pads exist in the high speed signal region, however this is only for convenience of the description and illustration, and a plurality of pairs of pads may actually exist in the high speed signal region.

Figure 16:
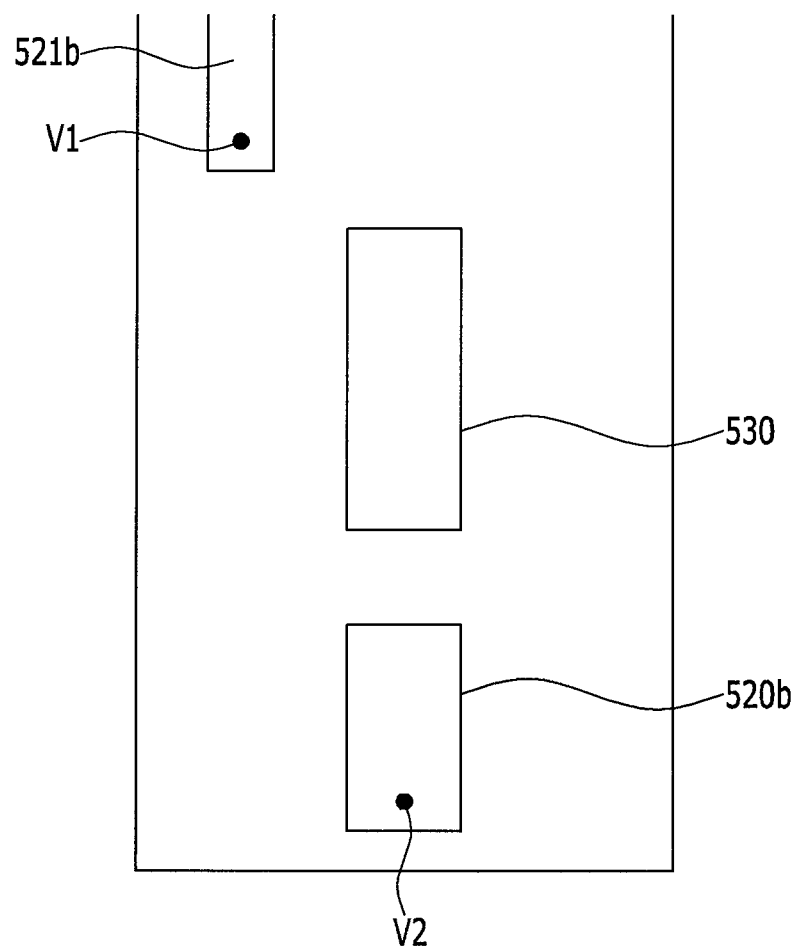
FIG. 16 is a view showing a first layer after dividing a high speed signal region of the chip on film of FIG. 15 for each layer.

FIG. 16 is a view showing a first layer after dividing a high speed signal region of the chip on film 500 of FIG. 15 for each layer. Referring to FIG. 16, the pad portion 520*b*, the dummy pad 530, and the divided wire 521*b* are at the first layer.

The first hole V1 is formed at one side of the divided wire 521*b*, and the second hole V2 is formed at one side of the pad portion 520*b* that is not coupled to the wire. The dummy pad 530 is isolated as an island shape and is not coupled anywhere, and a hole for coupling with other layers is not formed.

Figure 17:
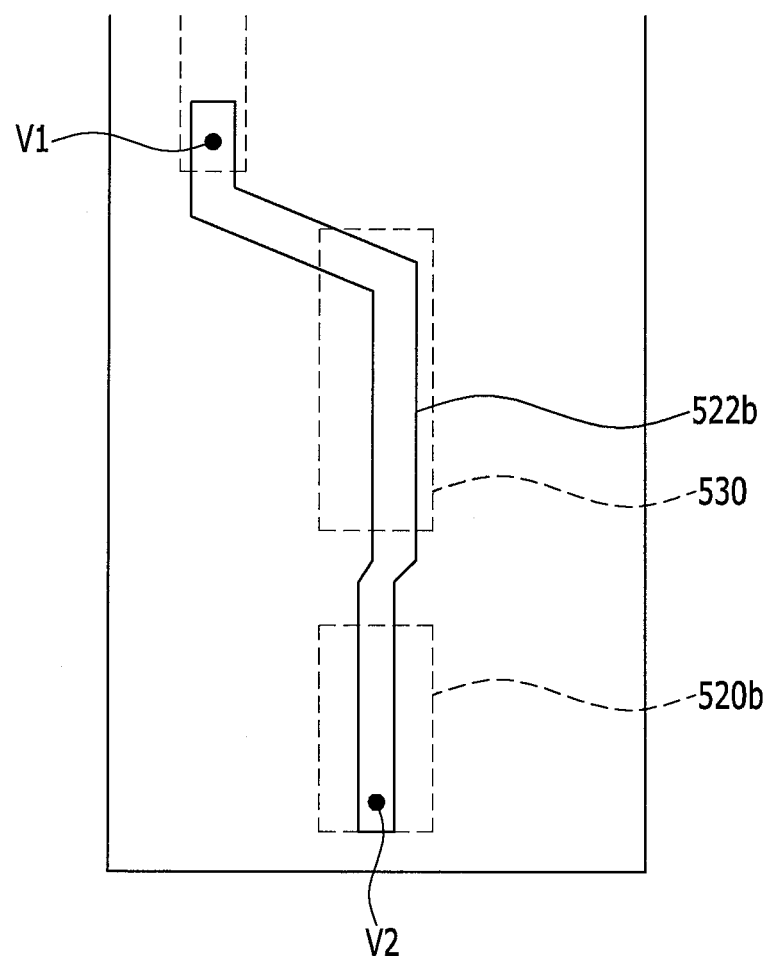
FIG. 17 is a view showing a second layer after dividing a high speed signal region of the chip on film of FIG. 15 for each layer.

FIG. 17 is a view showing a second layer after dividing a high speed signal region of the chip on film 500 of FIG. 15 for each layer.

Referring to FIG. 17, the wire 522*b* connecting the wire 521*b* and the pad 520*b* is formed at the second layer of the chip on film 500. The first hole V1 and the second hole V2 are formed at respective ends of the wire 522*b* to connect the wire 521*b* of the first layer and the pad 520*b*.

According to an embodiment, the wire 522*b* is electrically insulated from the dummy pad 530 and bent to pass the dummy pad. This is to obtain structural stability when pressing the chip on film 500 and the flexible printed circuit board (FPCB) 600 later. That is, the dummy pad 530 exists under the wire 522*b* such that an underlying step is not formed by the pressing process, thereby realizing a more stable contact.

As described above, in the display device according to an example embodiment of the present invention, one or more high speed signal regions are formed at the chip on film, the pair of signals are transmitted to the pads that are side by side at the same column in the high speed signal region, and the pad that is not transmitted with the signal is formed as the dummy pad that is not coupled to the pad, thereby solving the signal instability due the path difference when transmitting the high speed signal.

That is, referring to FIG. 5, in the comparative example, the lengths of the transmitting paths of the positive (+) signal and the negative (−) signal of the high speed signal are different such that the problem was generated.

However, referring to FIG. 15, in the example embodiment of the present invention, the dummy pad 530 is formed at the first row in the high speed signal region and the pads existing side by side at the second row are transmitted with the positive (+) signal and the negative (−) signal such that the transmitting paths of the pair of signals are the same. Accordingly, the signal instability may be solved.

Figure 21:
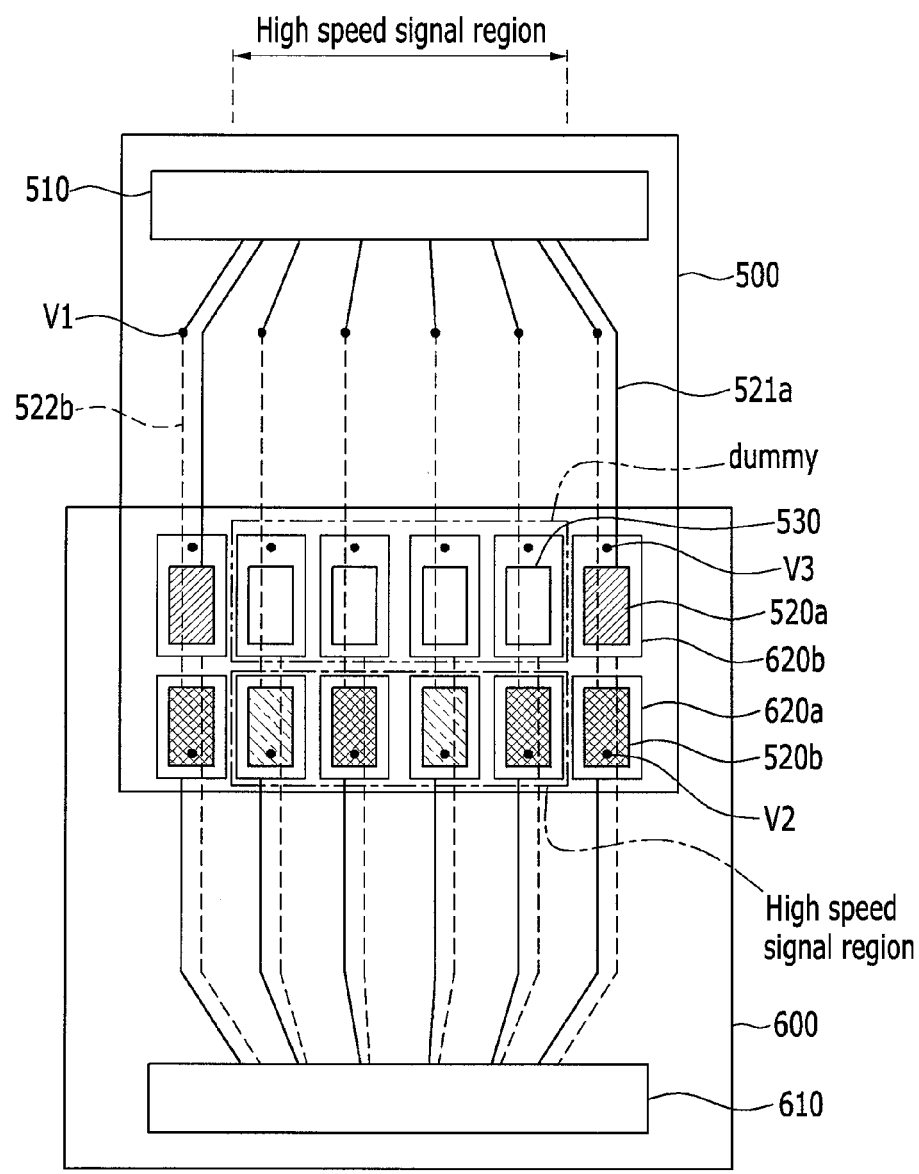
FIG. 21 is a view showing a connection relationship of a chip on film and a flexible printed circuit board (FPCB) in a display device according to an example embodiment of the present invention.

FIG. 21 is a view showing a connection relationship of a chip on film 500 and a flexible printed circuit board (FPCB) 600 in a display device according to an example embodiment of the present invention. Referring to FIG. 21, it may be confirmed that the dummy pad 530 is formed at the portion of the chip on film 500. The dummy pad 530 is not coupled to the driver 510.

Accordingly, the positive (+) signal and the negative (−) signal in the high speed signal region are transmitted to the pads for the high speed signal transmitting that are arranged side by side at the second row. In FIG. 21, the pad transmitting the positive (+) signal is indicated by the oblique line pattern, and the pad transmitting the negative (−) signal is indicated by the lattice pattern.

In an example embodiment of the present invention, the dummy pad 530 is not coupled to the driver 510, but is coupled to the pad 620*b* of the flexible printed circuit board (FPCB) 600 to be coupled to the flexible printed circuit board (FPCB) 600. However, the signal is not supplied from the driver 510 such that the signal is not transmitted to the flexible printed circuit board (FPCB) 600.

Figure 18:
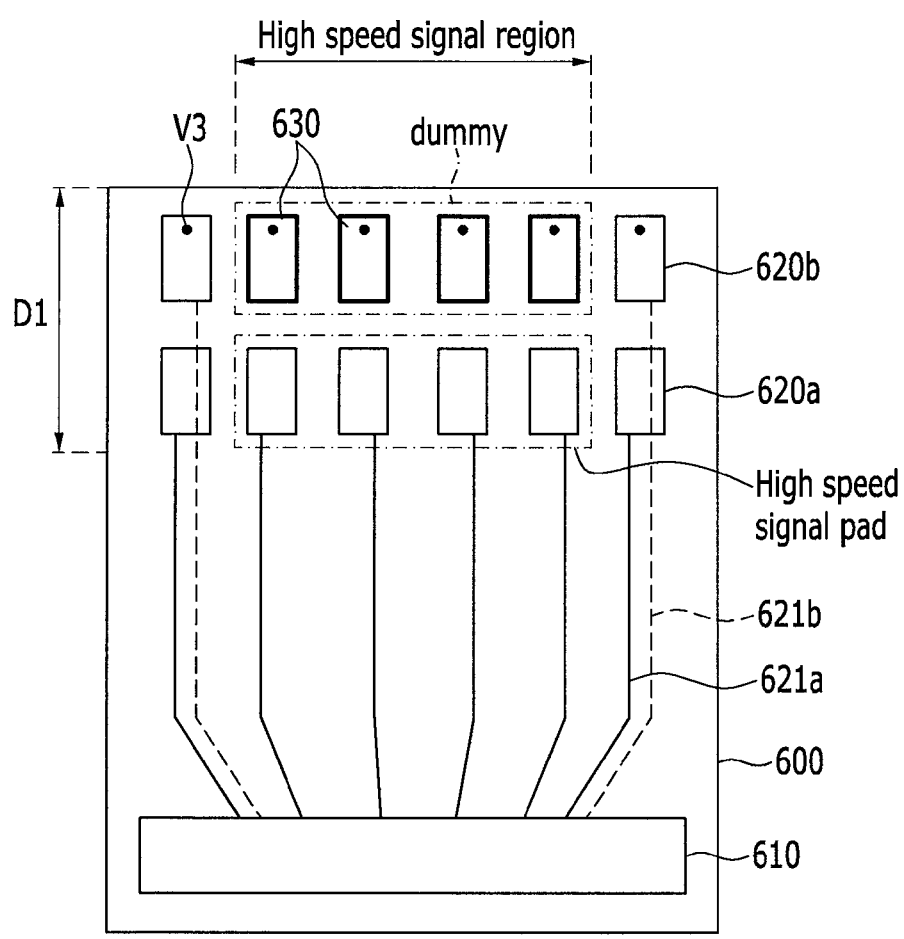
FIG. 18 is a view of a flexible printed circuit board (FPCB) according to the present example embodiment.
Figure 19:
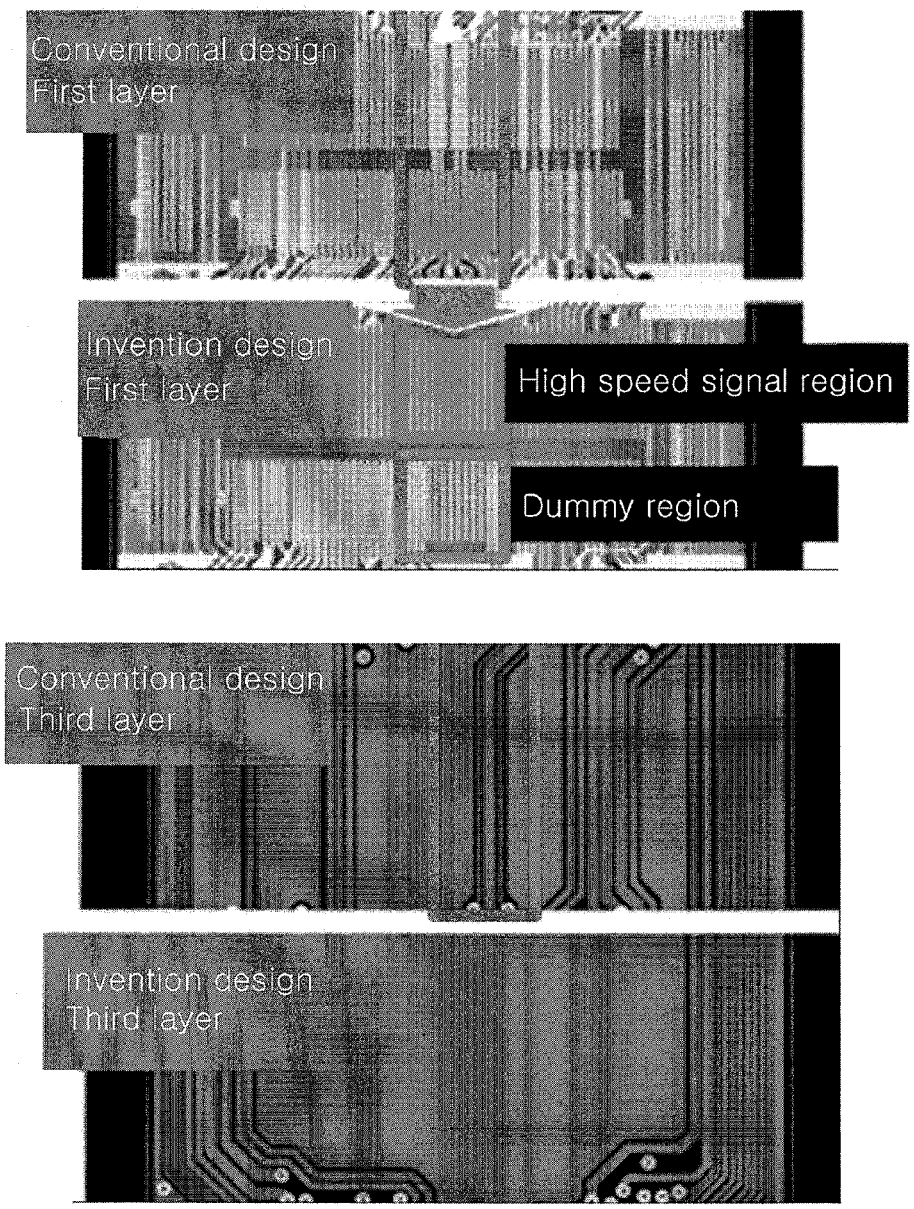
FIG. 19 is a view for comparing actual structures of a flexible printed circuit board (FPCB) according to an example embodiment of the present invention and a flexible printed circuit board (FPCB) according to a comparative example.
Figure 20:
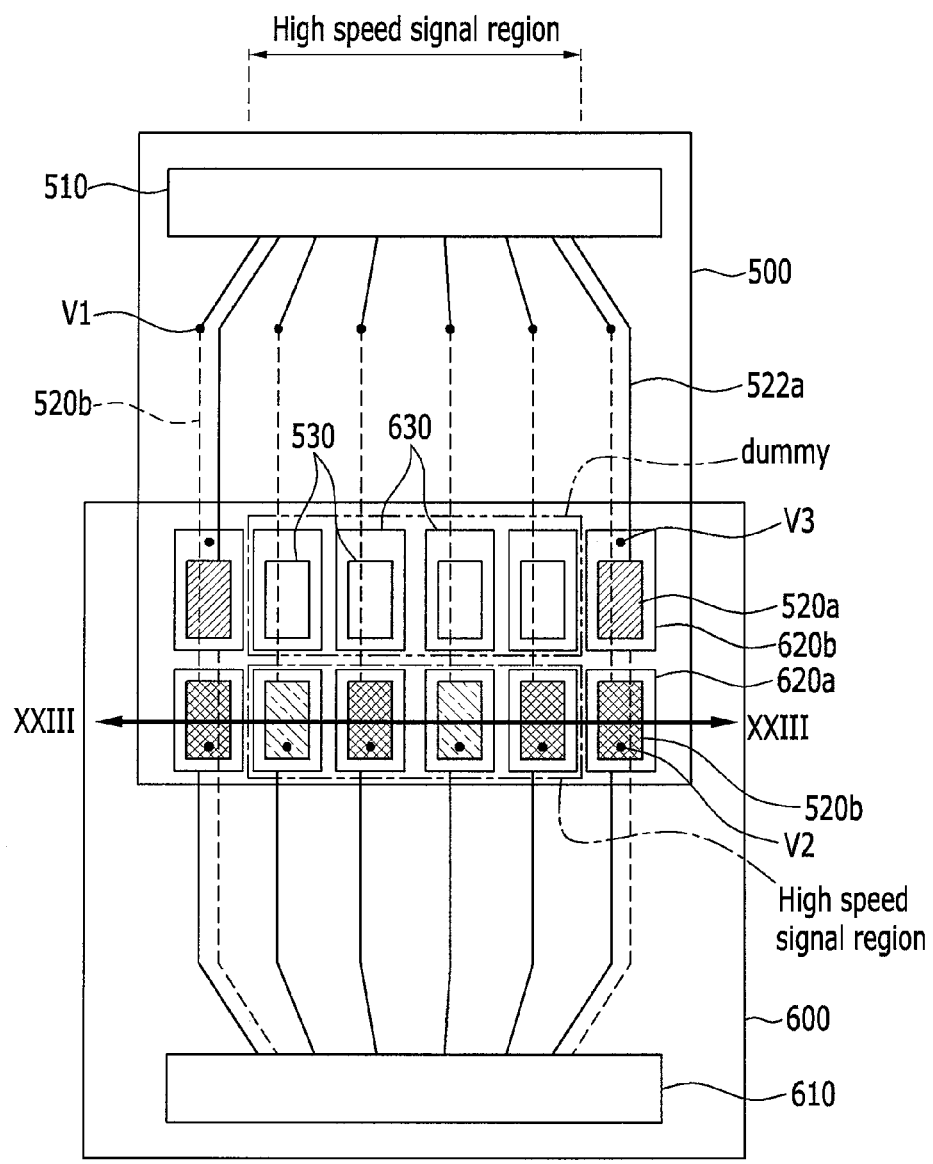
FIG. 20 is a view showing a connection relationship of a chip on film and a flexible printed circuit board (FPCB) in a display device according to an example embodiment of the present invention.
Figure 22:
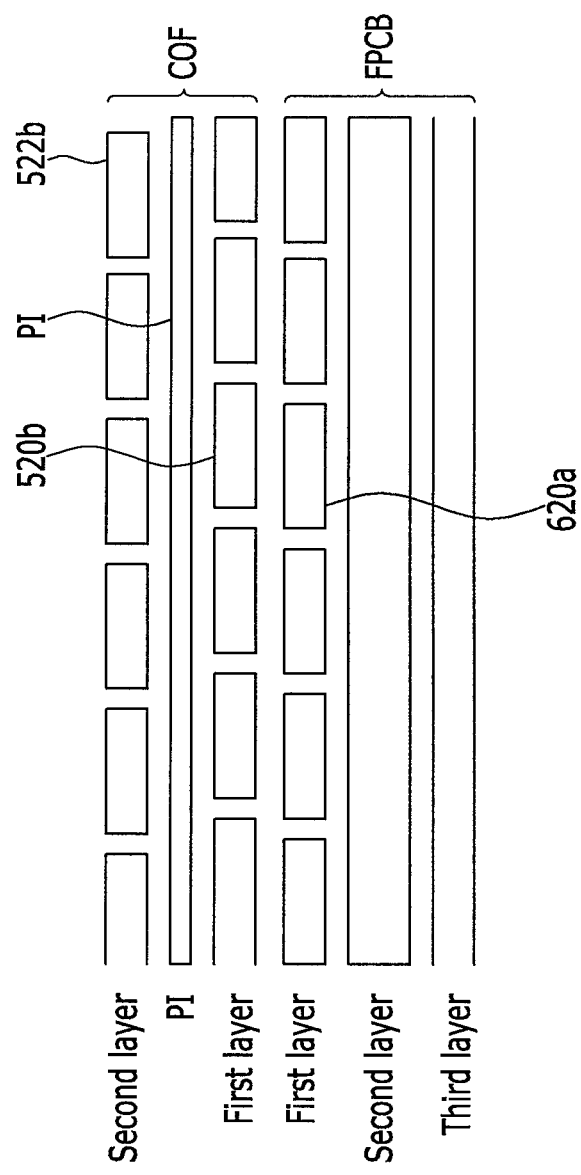
FIG. 22 is a cross-sectional view taken along the line XXIII-XXIII of FIG. 20.

A display device according to another example embodiment of the present invention will be described with reference to FIG. 18 to FIG. 20, and FIG. 22. FIG. 18 is a view of a flexible printed circuit board (FPCB) 600 according to an example embodiment. FIG. 19 is a view for comparing actual structures of a flexible printed circuit board (FPCB) 600 according to an example embodiment of the present invention and a flexible printed circuit board (FPCB) 600 according to a comparative example. FIG. 20 is a view showing a coupling relationship of a chip on film 500 and a flexible printed circuit board (FPCB) 600 in a display device according to an example embodiment of the present invention. FIG. 22 is a cross-sectional view taken along the line XXIII-XXIII of FIG. 20.

Firstly, referring to FIG. 20, in the display device according to the example embodiment, the shape of the chip on film 500 is the same as the previously described example embodiment. The detailed description for the same constituent elements is omitted. That is, in the display device according to the present example embodiment, the chip on film 500 includes one or more high speed signal regions, and in the high speed signal region, the pairs of signals are all transmitted to the pads existing side by side at the second row of the same column, and the pad that is not transmitted with the signal is the dummy pad that is not coupled to the driver.

The structure of the flexible printed circuit board (FPCB) 600 in the display device according to the present example embodiment will be described with reference to FIG. 18.

Referring to FIG. 18, the flexible printed circuit board (FPCB) 600 is divided into the general region and the high speed signal region like the chip on film 500. The high speed signal region is a region corresponding to the region where the dummy pad of the chip on film 500 is formed.

Referring to FIG. 18, a pad 630 of the flexible printed circuit board (FPCB) 600 contacting the dummy pad of the chip on film 500 is not coupled to the group portion 610. That is, the pad of the flexible printed circuit board (FPCB) 600 contacting the dummy pad 530 of the chip on film 500 is formed of the dummy pad 630 that is not coupled to the group portion 610.

Accordingly, in the high speed signal region including the dummy pad 630, the wire connecting the dummy pad 630 of the flexible printed circuit board (FPCB) and the group portion 610 is removed. The dummy pad 630 of the flexible printed circuit board (FPCB) 600 is the region that contacts the dummy pad 530 of the chip on film 500 such that the signal is not supplied from the driver 510 of the chip on film 500. Therefore, it is not necessary to connect the group portion 610 and the wire.

As described above, by forming the dummy pad 630 of the flexible printed circuit board (FPCB) 600, the wire 621b connecting the pad of the flexible printed circuit board (FPCB) 600 and the group portion 610 may be removed at the third layer in the high speed signal region. In this case, the via to pass the wire may also be removed at the third layer of the flexible printed circuit board (FPCB) 600 such that the structural stability may be improved.

FIG. 19 shows actual images of the first layer and the third layer of the flexible printed circuit board (FPCB) 600 in the comparative example and the example embodiment. Referring to FIG. 19, in a conventional design structure of the comparative example, the first row pad and the second row pad of the first layer are also coupled to the group portion, and the group portion and the pad are coupled to the wire passing the third layer. Accordingly, as shown in FIG. 19, the via passing the wire is formed at the third layer.

However, in an embodiment, the pads of the region transmitted with the high speed signal are divided into the dummy pad and the pad that actually transmits the signal in the flexible printed circuit board (FPCB), and the dummy pad is not coupled to the group portion. Accordingly, as shown in FIG. 19, in the region where the high speed signal is transmitted, the via is formed at the third layer.

FIG. 20 shows the coupling relationship of the chip on film 500 and a flexible printed circuit board (FPCB) 600 in the display device according to an example embodiment of the present invention. In the example embodiment, the dummy pad 530 of the chip on film 500 is coupled to the dummy pad 630 of the flexible printed circuit board (FPCB) 600. The dummy pad 530 of the chip on film 500 is not coupled to the driver 510, and the dummy pad 630 of the flexible printed circuit board (FPCB) 600 is not coupled to the group portion 610. Accordingly, the wire coupled in the dummy pads 530 and 630 does not exist.

FIG. 22 is a cross-sectional view of the display device according to the example embodiment of FIG. 20 taken along the line XXIII-XXIII.

Referring to FIG. 20 and FIG. 22, the dummy pad 630 of the flexible printed circuit board (FPCB) 600 is not coupled to the group portion 610 such that the via to pass the wire is not required at the third layer (e.g., the lowest layer of FIG. 22) of the flexible printed circuit board (FPCB) 600. Compared with the FIG. 13 as the comparative example, the difference may be confirmed.

Accordingly, in the display device according to the example embodiment, the step due to the via does not exist at the lowest end of the flexible printed circuit board (FPCB) 600 when pressing for the adhesion of the flexible printed circuit board (FPCB) 600 and the chip on film 500 such that they may be stably pressed. Referring to FIG. 13, in the case of the comparative example, the step due to the formation of the via exists and this generates structural instability from the pressing.

However, referring to FIG. 22, in the display device according to the present example embodiment, the step caused by the formation of the via does not exist under the flexible printed circuit board (FPCB), and accordingly, the pressing for the contact is structurally stable.

That is, the display device according to the present example embodiment forms the dummy pad in the chip on film such that the lengths of the transmitting paths of the positive (+) signal and the negative (−) signal of the high speed signal are the same, thereby solving the instability of the signal. Also, the pad of the flexible printed circuit board (FPCB) in contact with the dummy pad of the chip on film is formed of the dummy pad and the via required to be formed at the third layer of the flexible printed circuit board (FPCB) is removed, thereby obtaining the structural stability.

Figure 23:
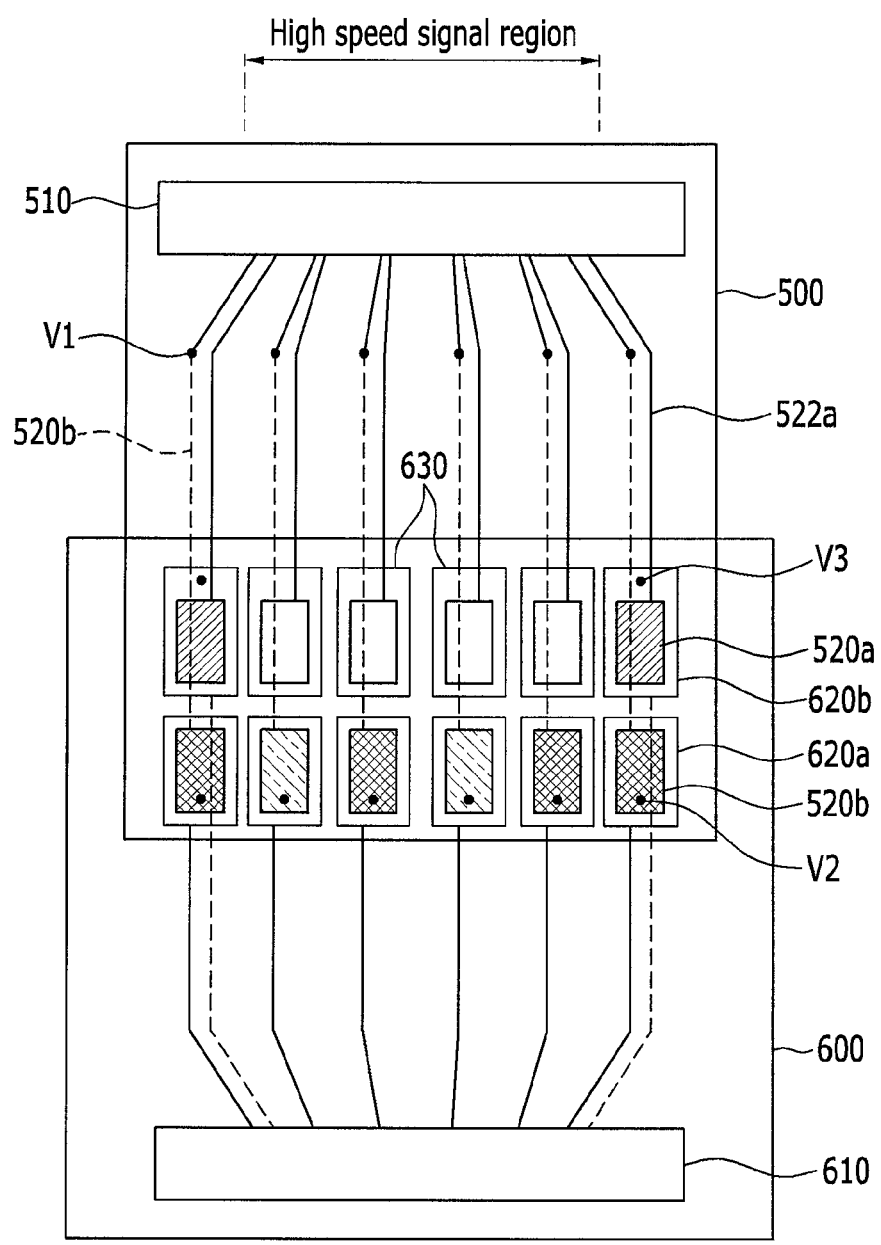
FIG. 23 is a view showing a connection relationship of a chip on film and a flexible printed circuit board (FPCB) in a display device according to another example embodiment of the present invention.

Another example embodiment of the present invention will be described with reference to FIG. 23. FIG. 23 is a view showing a connection relationship of a chip on film 500 and a flexible printed circuit board (FPCB) 600 in a display device according to another example embodiment of the present invention.

Referring to FIG. 23, the shape of the chip on film 500 of the display device according to the present example embodiment is the same as the chip on film 500 according to the comparative example. That is, in the present example embodiment, the chip on film 500 does not include the dummy pad. That is, in the present example embodiment, the shape of the chip on film 500 is similar to that of FIG. 4. However, referring to FIG. 23, in the high speed signal transmitting region, the positive (+) signal and the negative (−) signal are transmitted to the adjacent pads positioned at the second row. That is, in FIG. 23, the pad shown with the oblique line pattern is the pad transmitting the positive (+)

signal, and the pad shown with the lattice pattern is the pad transmitting the negative (−) signal.

Referring to FIG. 23, the shape of the flexible printed circuit board (FPCB) 600 of the display device according to the present example embodiment is the same as the shape of the flexible printed circuit board (FPCB) 600 according to the previous example embodiment. That is, the shape of the flexible printed circuit board (FPCB) 600 is the same as that shown in FIG. 18 and FIG. 19. The detailed description of the same constituent elements is omitted.

That is, the shape of the chip on film 500 of the display device of the present example embodiment is the same as the comparative example, however the shape of the flexible printed circuit board (FPCB) 600 is modified in the present example embodiment.

In this case, the dummy pad 630 formed in the high speed signal region of the flexible printed circuit board (FPCB) 600 is not coupled to the group portion 610 such that the wire for connection of the dummy pad 630 and the group portion 610 is not required at the third layer of the flexible printed circuit board (FPCB) 600. Accordingly, the via to pass the wire is not required at the third layer.

Accordingly, in the high speed signal region of the flexible printed circuit board (FPCB) 600, a step does not exist such that the structural stability may be obtained. Also, in the chip on film 500, the high speed signals are transmitted to the adjacent pads positioned at the second row such that the signal stability by the signal transmitting path difference when transmitting the high speed signal may be solved.

As described above, in the display device according to the embodiments of the present invention, 1) the dummy pad may be formed at the chip on film, 2) the dummy pad may be formed at the flexible printed circuit board (FPCB), or 3) the dummy pad may be formed at both, the chip on film and the flexible printed circuit board (FPCB), and thereby the instability of the signal when transmitting the high speed signal may be solved, and the structural instability may be solved in the contact process of the chip on film and the flexible printed circuit board (FPCB).

While this invention has been described in connection with what is presently considered to be practical example embodiments, it is to be understood that the invention is not limited to the disclosed embodiments, but, on the contrary, it is intended to cover various modifications and equivalent arrangements included within the spirit and scope of the appended claims and their equivalents.

| Description of some of the Symbols | |
|---|---|
| 100: lower substrate | 200: upper substrate |
| 400: cover glass | 700: protection layer |
| 500: chip on film | 510: driver |
| 520a, 520b: pad | 521a, 521b, 522b: wire |
| 530: dummy pad, | 600: flexible printed circuit board (FPCB): |
| 620a, 602b: pad | 621a, 621b: wire |
| 630: dummy pad | V1, V2, V3: hole |

What is claimed is:

1. A display device comprising:
a display panel configured to display an image, the display panel comprising a plurality of pixels;
a chip on film (COF) coupled to the display panel, the COF comprising a driver, a plurality of COF wires and a plurality of COF pads; and
a flexible printed circuit board (FPCB) coupled to the COF, the FPCB comprising a plurality of FPCB wires and a plurality of FPCB pads,
wherein the plurality of COF pads are arranged in two rows,
wherein one or more COF pads of the plurality of COF pads in a first row of the two rows are one or more dummy pads,
wherein the one or more dummy pads are at a high speed signal transmitting region,
wherein, in the high speed signal transmitting region, the one or more dummy pads are arranged at the first row and high speed signal pads of the plurality of COF pads are arranged at a second row of the two rows, and
wherein a pair of adjacent high speed signal pads of the plurality of COF pads are supplied with positive (+) and negative (−) signals from the driver.

2. The display device of claim 1, wherein:
the driver of the COF is coupled to the plurality of COF pads by the plurality of COF wires; and
the plurality of COF wires coupling the plurality of COF pads in the first row to the driver are formed at different layers from the plurality of COF wires coupling the plurality of COF pads of a second row of the two rows to the driver.

3. The display device of claim 1, wherein the one or more dummy pads are not coupled to the driver by the plurality of COF wires.

4. The display device of claim 1, wherein the lengths of the plurality of COF wires coupling the driver and each of the pair of adjacent high speed signal pads of the plurality of COF pads are the same.

5. The display device of claim 1, wherein the high speed signal transmitting region comprises a plurality of high speed signal transmitting regions in one COF.

6. The display device of claim 1, wherein the width of each of the dummy pads is larger than the width of each of the other COF pads.

7. The display device of claim 1, wherein:
the plurality of FPCB pads are arranged in two rows;
the plurality of FPCB pads are coupled to the plurality of COF pads; and
one or more FPCB pads of the plurality of FPCB pads coupled with the one or more dummy pads of the COF are one or more dummy pads of the FPCB.

8. The display device of claim 7, wherein
the one or more dummy pads of the FPCB are not coupled to a group portion in which the FPCB wires are gathered.

9. The display device of claim 7, wherein the FPCB further comprises: a group portion at one side of the FPCB,
wherein the plurality of FPCB pads are coupled to the group portion by the plurality of FPCB wires; and
the plurality of FPCB wires coupling the plurality of FPCB pads in a first row of the two rows and the plurality of FPCB wires coupling the plurality of FPCB pads in a second row of the two rows are at different layers.

10. The display device of claim 9, wherein:
the plurality of FPCB wires coupling the plurality of FPCB pads of the first row to the group portion are at a first layer of the FPCB;
the plurality of FPCB wires coupling the plurality of FPCB pads of the second row to the group portion are at a third layer of the FPCB;
a plane plate is between the first layer and the third layer; and the third layer includes a plurality of grooves to pass the plurality of FPCB wires.

11. The display device of claim 10, wherein:

a region where the one or more dummy pads of the FPCB are located is a high speed signal transmitting region;

in the high speed signal transmitting region, the one or more dummy pads are at the first row and high speed signal pads of the plurality of COF pads are at the second row; and the groove is not located in the high speed signal transmitting region.

\* \* \* \* \*